(12) United States Patent
Miyake et al.

(10) Patent No.: US 9,660,039 B2
(45) Date of Patent: May 23, 2017

(54) DISPLAY DEVICE

(71) Applicant: Japan Display Inc., Minato-ku (JP)

(72) Inventors: Hidekazu Miyake, Tokyo (JP);
Arichika Ishida, Tokyo (JP); Hiroto Miyake, Tokyo (JP); Isao Suzumura, Tokyo (JP); Yohei Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/062,887

(22) Filed: Mar. 7, 2016

(65) Prior Publication Data

US 2016/0268417 A1    Sep. 15, 2016

(30) Foreign Application Priority Data

Mar. 11, 2015    (JP) .................................. 2015-048140

(51) Int. Cl.
*H01L 29/49* (2006.01)
*H01L 29/417* (2006.01)
*H01L 29/786* (2006.01)

(52) U.S. Cl.
CPC .. *H01L 29/41733* (2013.01); *H01L 29/78696* (2013.01)

(58) Field of Classification Search
CPC .............................................. H01L 29/41733
See application file for complete search history.

(56) References Cited

U.S. PATENT DOCUMENTS

| | | | | |
|---|---|---|---|---|
| 6,636,284 B2 * | 10/2003 | Sato | .................. | G02F 1/136209 349/110 |
| 6,798,405 B2 * | 9/2004 | Anzai | ................. | H01L 27/3262 257/350 |
| 7,943,935 B2 * | 5/2011 | Ishiguro | ............ | H01L 29/42384 257/66 |
| 8,253,131 B2 * | 8/2012 | Takeuchi | ............ | H01L 27/3246 257/40 |
| 9,240,491 B2 * | 1/2016 | Ito | ....................... | H01L 29/7869 |

FOREIGN PATENT DOCUMENTS

JP    2003-142681    5/2003

* cited by examiner

*Primary Examiner* — Michael Shingleton
(74) *Attorney, Agent, or Firm* — Oblon, McClelland, Maier & Neustadt, L.L.P.

(57) ABSTRACT

According to one embodiment, a thin-film transistor includes a semiconductor layer SC including a channel region, and a source region and a drain region on both sides of the channel region, a gate electrode GE, a first electrode SE connected to the source region via a first contact hole CH1, a second electrode DE connected to the drain region via a second contact hole CH2, a source line connected to the first electrode, and a drain line connected to the second electrode. A distance from the first and second contact holes to an end of the respective regions in a direction of a channel width is greater than or equal to 5 μm and less than or equal to 30 μm. The source line and the drain line extend in directions different from each other.

11 Claims, 7 Drawing Sheets

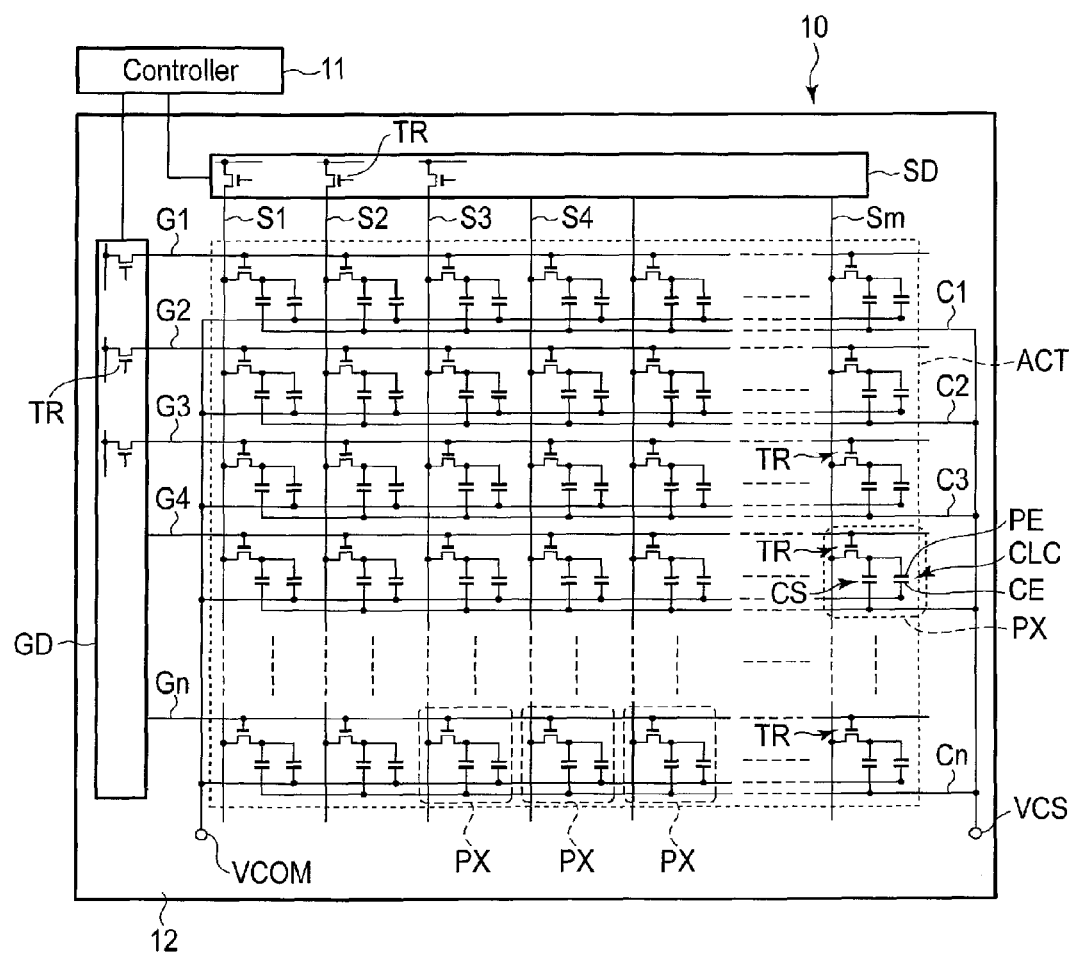
F I G. 1

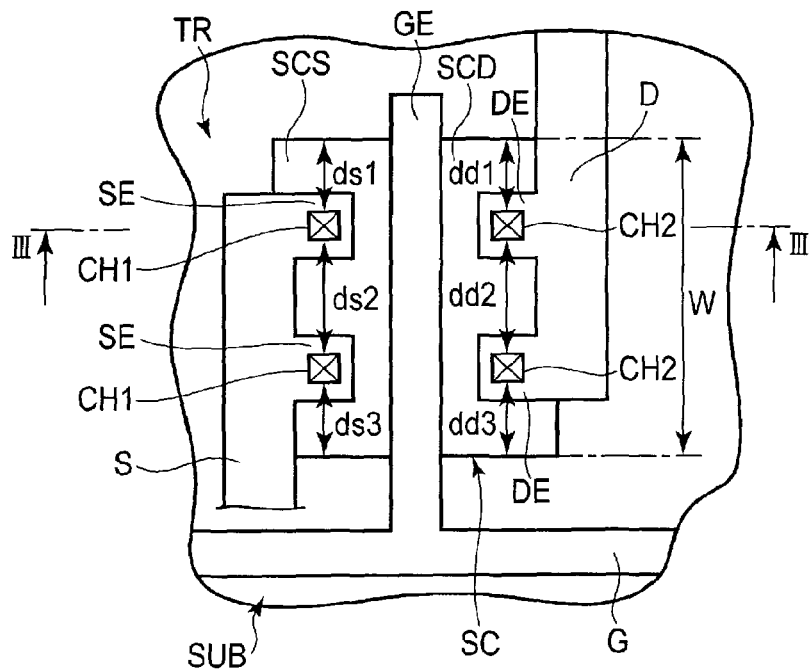
F I G. 2
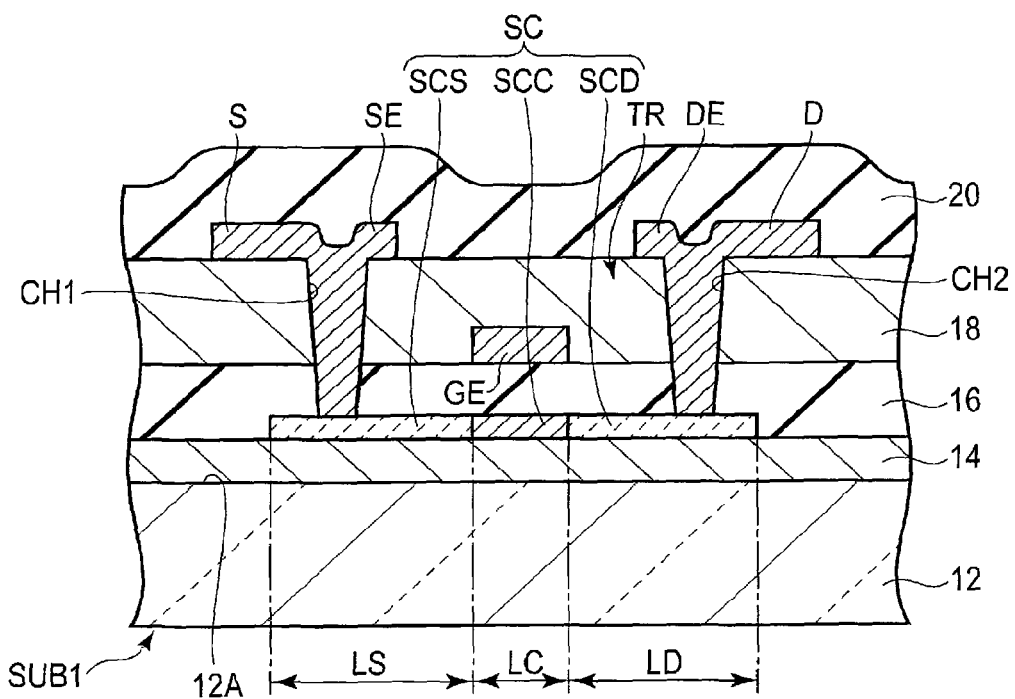
F I G. 3

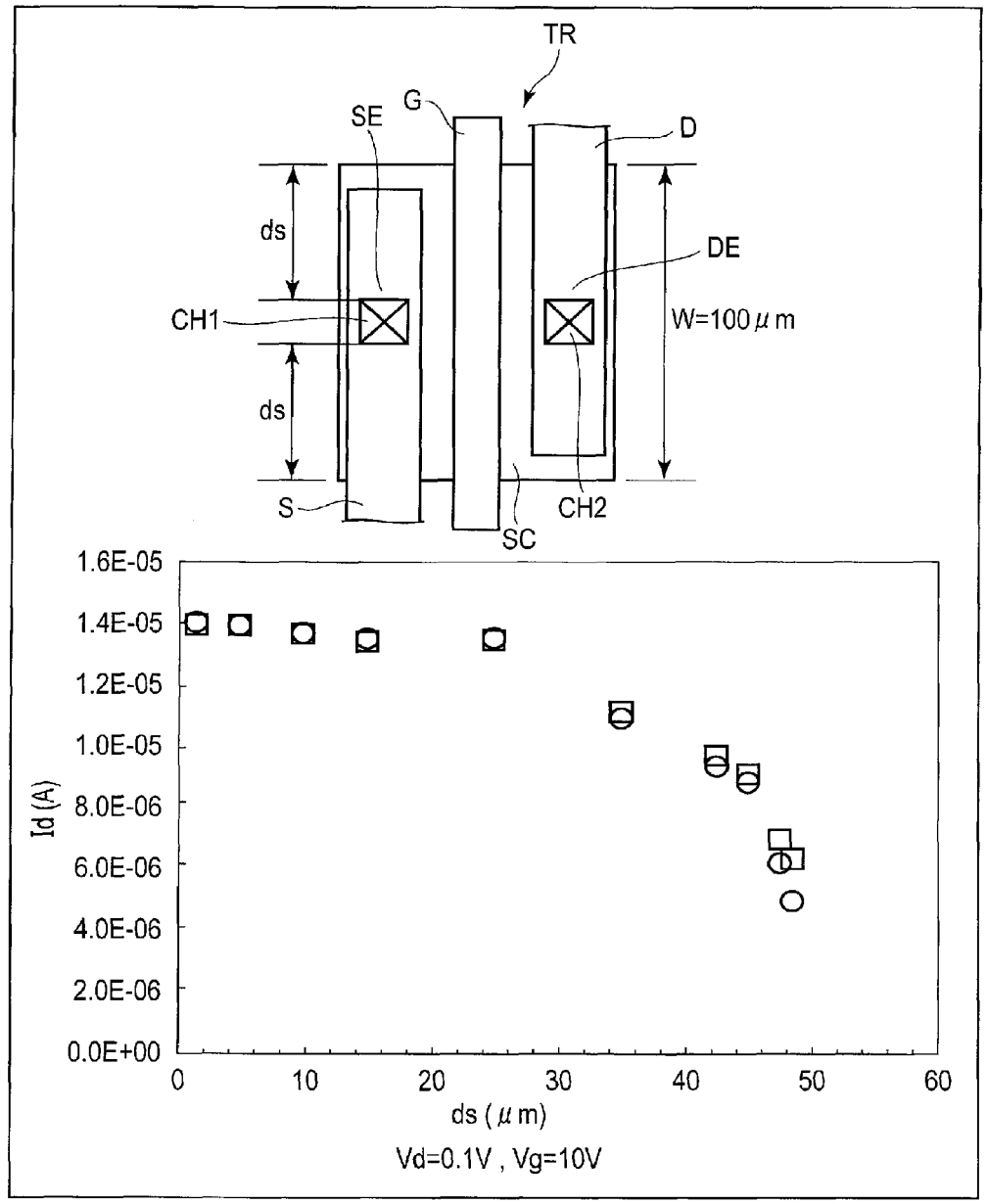
F I G. 4

| Schematic view | Comparative example | First embodiment | Third embodiment | Fourth embodiment |
|---|---|---|---|---|
| Cgs+Cgd | 0.98 | 0.95 | 0.87 | 0.93 |
| Cds | 0.02 | 0.02 | 0.01 | 0.02 |
| Ct | 1.00 | 0.97 | 0.88 | 0.95 |

F I G. 10

DISPLAY DEVICE

CROSS-REFERENCE TO RELATED APPLICATIONS

This application is based upon and claims the benefit of priority from Japanese Patent Application No. 2015-048140, filed Mar. 11, 2015, the entire contents of which are incorporated herein by reference.

FIELD

Embodiments described herein relate generally to a thin-film transistor used for a display device, etc.

BACKGROUND

Recently, display devices comprising a thin-film transistor (TFT) as a semiconductor device have been put into practical use. As examples of display devices, a liquid crystal display device and an organic electroluminescent display device are considered. These types of display devices are increasingly required to narrow the frame of the display portion year by year.

To fulfill this demand, miniaturization should be realized by improving the driving performance of the semiconductor device. To enhance the driving performance of the semiconductor device, for example, improvement of field-effect mobility of the semiconductor, acquisition of a thin gate insulating film, and reduction of parasitic capacitance can be considered. However, the improvement of mobility will cause the manufacturing throughput to be decreased. When the thickness of the gate insulating film is reduced, yields may be decreased. Thus, in fact, it is difficult to apply these methods.

As a measure to reduce the parasitic capacitance, a semiconductor device comprising an insulated gate field effect transistor is suggested. In this semiconductor device, the number of wiring contact portions for the source region of the transistor is greater than the number of wiring contact portions for the drain region. The interval between the contact portion of the gate line for the gate electrode and the wiring contact portion for the drain region is set to be greater than the interval between the contact portion of the gate line for the gate electrode and the wiring contact portion for the source region.

However, when the above semiconductor device is applied to a pixel transistor or a transistor for color selection used for a liquid crystal display, etc., the voltage relationship of the source and the drain may be reversed (in other words, inversion drive). Thus, it is difficult to obtain an effect of reduction of parasitic capacitance.

BRIEF DESCRIPTION OF THE DRAWINGS

FIG. 1 is a plan view schematically showing a structural example of a display device according to a first embodiment.

FIG. 2 is a plan view schematically showing a structural example of an array substrate applicable to the liquid crystal display device shown in FIG. 1.

FIG. 3 is a cross-sectional view showing a structural example of the array substrate, taken along line III-III of FIG. 2.

FIG. 4 shows a thin-film transistor of a measurement model and the relationship between an interval ds and the output current Id of the transistor.

FIG. 10 is a view showing the comparison of results obtained by measuring the parasitic capacitances of the thin-film transistors of the comparative example, the first embodiment, the third embodiment and the fourth embodiment.

DETAILED DESCRIPTION

Figure 5:
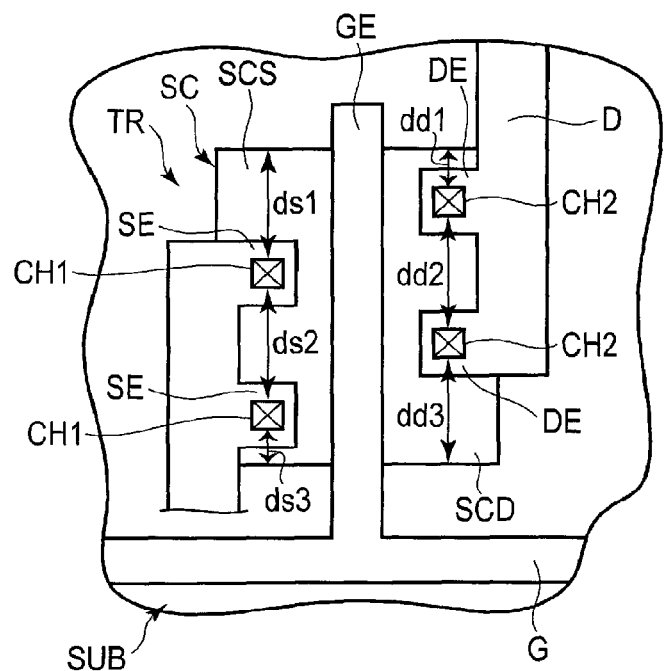
FIG. 5 is a plan view schematically showing a structural example of a thin-film transistor of a display device according to a second embodiment.

Various embodiments will be described hereinafter with reference to the accompanying drawings. In general, according to one embodiment, a thin-film transistor comprises: a semiconductor layer comprising: a channel region having a channel length and a channel width greater than the channel length; and a source region and a drain region on both sides of the channel region; a gate electrode which faces the channel region with a first insulating layer being interposed; a second insulating layer which covers the first insulating layer and a gate electrode; a first electrode connected to the source region via a first contact hole formed on the first and second insulating layers; a second electrode connected to the drain region via a second contact hole formed on the first and second insulating layers; a source line connected to the first electrode; and a drain line connected to the second electrode. A distance from the first and second contact holes to an end of the respective regions in a direction of the channel width is greater than or equal to 5 µm and less than or equal to 30 µm in the source region and the drain region, and the source line and the drain line extend in directions different from each other.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are illustrated schematically, not accurately and to scale, in the drawings. However, the schematic illustrations are merely exemplary and add no restrictions to the interpretation of the invention. Also, in the specification and drawings, the same elements as those described in connection with preceding drawings are denoted by like reference numbers, and detailed descriptions thereof are omitted unless otherwise necessary.

First Embodiment

FIG. 1 schematically shows a structural example of a display device according to a first embodiment. Here, this specification explains a liquid crystal display device as an example of a display device comprising a semiconductor device. A liquid crystal display device 10 can be used when it is incorporated into various types of electronic devices such as a smartphone, a tablet terminal, a mobile phone, a notebook computer, a portable games console, an electronic dictionary and a television device.

As shown in FIG. 1, the liquid crystal display device 10 comprises a display portion (active area) ACT which displays an image, and drive circuits GD and SD which drive the display portion ACT. The display portion ACT comprises a plurality of display pixels PX arrayed in a matrix.

For example, a plurality of gate lines G (G1 to Gn), a plurality of capacitance lines C (C1 to Cn) and a plurality of video signal lines (source lines) S (S1 to Sm) are formed in the display portion ACT. Each gate line G extends to the outside of the display portion ACT and is connected to the gate line drive circuit GD. Each signal line S extends to the outside of the display portion ACT and is connected to the signal line drive circuit SD. Each capacitance line C is electrically connected to a voltage application portion VCS to which storage capacitance voltage is applied. The gate line drive circuit GD and the signal line drive circuit SD comprise a plurality of thin-film transistors (TFTs) TR each functioning as a switching element, and are formed outside the display portion ACT integrally on an insulating substrate 12. The gate line drive circuit GD and the signal line drive circuit SD are connected to a controller 11.

Each display pixel PX comprises, for example, liquid crystal capacitance CLC, a thin-film transistor (TFT) TR, storage capacitance CS in parallel with the liquid crystal capacitance CLC. The liquid crystal capacitance CLC comprises a pixel electrode PE connected to the thin-film transistor TR, a common electrode CE electrically connected to a supply portion VCOM having common potential, and a liquid crystal layer interposed between the pixel electrode PE and the common electrode CE.

The thin-film transistors TR are electrically connected to the gate lines G and the signal lines S. Control signals for controlling the on-state or off-state of the thin-film transistors TR are supplied from the gate line drive circuit GD to the gate lines G. Video signals are supplied from the signal line drive circuit SD to the signal lines S. When a thin-film transistor TR is turned on based on a control signal supplied to the gate line G, the thin-film transistor TR writes pixel potential to the pixel electrode PE in accordance with a video signal supplied to the signal line S. The voltage applied to the liquid crystal layer is controlled by the difference in potential between the common electrode CE having common potential and the pixel electrode PE having pixel potential.

FIG. 2 is a plan view schematically showing a structural example of an array substrate applicable to the liquid crystal display device 10 shown in FIG. 1. FIG. 3 is a cross-sectional view of the array substrate and the thin-film transistor along line of FIG. 2.

An array substrate SUB1 is formed by using the insulating substrate 12 having a light transmissive property, such as a glass substrate or a resin substrate. The array substrate SUB1 comprises the thin-film transistor TR and the storage capacitance for each display pixel PX on the insulating substrate 12. The array substrate SUB1 further comprises the plurality of thin-film transistors TR for the gate line drive circuit GD and the signal line drive circuit SD on the insulating substrate 12. Here, this specification looks at the thin-film transistor TR which functions as a semiconductor device in each display pixel PX. In the following description, this thin-film transistor TR is explained in detail.

In the structural example shown in FIG. 2 and FIG. 3, an inner surface 12A of the insulating substrate 12 is covered by an undercoat layer (insulating layer) 14. The undercoat layer 14 is formed of, for example, silicon oxide (SiOx) or silicon oxynitride (SiONy).

The thin-film transistor TR comprises a semiconductor layer SC provided on the undercoat layer 14, a gate electrode GE provided on the semiconductor layer SC with a gate insulating layer (first insulating layer) 16 being interposed, a source electrode SE and a drain electrode DE. The source electrode SE and the drain electrode DE are provided on an interlayer insulating layer (second insulating layer) 18 covering the gate electrode GE. The thin-film transistor TR structures a top-gate transistor. A protective film 20 is formed on the interlayer insulating layer 18 and covers the source electrode SE, the drain electrode DE and the wiring described later.

The semiconductor layer SC is formed on the first insulating layer 14. The semiconductor layer SC is formed of, for example, low-temperature polysilicon. The semiconductor layer SC is patterned into a rectangular shape. The semiconductor layer SC comprises a channel region SCC, a source region SCS and a drain region SCD. The source region SCS and the drain region SCD are located on the both sides of the channel region SCC, and are doped with phosphorus. The resistance of the source region SCS and the drain region SCD is less than that of the channel region SCC. A low-concentration impurity region (LDD) may be provided between the channel region SCC and the source region SCS and between the channel region SCC and the drain region SCD.

The channel region SCC has a channel length LC and a channel width W. The channel width W is greater than the channel length LC. For example, the channel length LS is set to 3 μm, and the channel width W is set to 100 μm.

Each of the source region SCS and the drain region SCD is formed in a rectangular shape. The source region SCS and the drain region SCD have a length LS and a length LD, respectively, in the direction of the channel length. The width of each of the source region SCS and the drain region SCD is the same as the channel width W. The lengths LS and LD are sufficiently greater than the channel length LC and are equal to each other.

The gate insulating layer (first insulating layer) 16 is formed on the semiconductor layer SC and covers the semiconductor layer SC. The gate electrode GE is provided on the gate insulating layer 16 and faces the channel region SCC of the semiconductor layer SC. The channel region SCC faces the gate electrode GE with the gate insulating layer 16 being interposed.

The gate electrode GE is formed of a wiring material. For example, the gate electrode GE is formed of a metal material such as molybdenum, tungsten, aluminum or titanium, or alloy containing these metal materials. For example, the gate electrode GE is electrically connected to the gate line G provided on the same layer as the gate electrode, or is formed integrally with the gate line G.

The gate electrode GE and the gate insulating layer 16 are covered by the interlayer insulating layer (second insulating layer) 18. As the material of the interlayer insulating layer 18, for example, silicon oxide (SiOx) or silicon oxynitride (SiONy) may be used.

The source electrode SE and the drain electrode DE for the thin-film transistor TR, a signal line S and a drain line D are formed on the interlayer insulating layer 18. In the present embodiment, a plurality of, for example, two source electrodes SE are provided. The source electrodes SE are in contact with the source region SCS of the semiconductor layer SC via their respective contact holes (first contact holes) CH1 penetrating the interlayer insulating layer 18 and the gate insulating layer 16. The two source electrodes SE are provided away from each other in the width direction of the source region SCS. The two contact holes CH1 are also provided away from each other in the width direction of the source region SCS.

The interval ds1 between one of the contact holes CH1 and an end of, here, the upper end of the source region SCS in the width direction, the interval ds2 between the two contact holes CH1, and the interval ds3 between the other contact hole CH1 and the other end of, here, the lower end of the source region SCS in the width direction are set such that each of these intervals is greater than or equal to 5 μm and less than or equal to 30 μm.

Each source electrode SE is formed in, for example, a rectangular shape, and is connected to the signal line S on a side opposite to the gate electrode GE. The signal line S extends from one of the source electrodes SE to the gate line G side through the other source electrode SE along the direction of the channel width.

A plurality of, for example, two drain electrodes DE are provided. The two drain electrodes DE are in contact with the drain region SCD of the semiconductor layer SC via their respective contact holes (second contact holes) CH2 penetrating the interlayer insulating layer 18 and the gate insulating layer 16. The two drain electrodes DE are provided away from each other in the width direction of the drain region SCD. The two contact holes CH2 are also provided away from each other in the width direction of the drain region SCD.

The interval dd1 between one of the contact holes CH2 and an end of, here, the upper end of the drain region SCD in the width direction, the interval dd2 between the two contact holes CH2, and the interval dd3 between the other contact hole CH2 and the other end of, here, the lower end of the drain region SCD in the width direction are set such that each of these intervals is greater than or equal to 5 μm and less than or equal to 30 μm.

Each drain electrode DE is formed in, for example, a rectangular shape, and is connected to the drain line D on a side opposite to the gate electrode GE. The drain line D extends from one of the drain electrodes DE in a direction opposite to the gate line G through the other drain electrode DE along the direction of the channel width. Thus, the drain line D extends in a direction opposite to that of the signal line S. The drain line D is connected to the pixel electrode of the display pixel PX.

In the present embodiment, the two drain electrodes DE and the two contact holes CH2, and the two source electrodes SE and the two contact holes CH1 are provided symmetrically with respect to the gate electrode GE. The drain line D and the signal line S are formed asymmetrically with respect to the gate electrode GE.

In the present embodiment, the source electrodes SE, the drain electrodes DE, the signal line S and the drain line D are formed by the same wiring material.

The source electrodes SE, the drain electrodes DE, the signal line S and the drain line D are covered by the protective film 20. As the material of the protective film 20, for example, silicon oxide (SiOx) or silicon oxynitride (SiONy) may be used. The pixel electrode PE is provided on the protective film 20. A part of the pixel electrode PE is connected to the drain line D via a contact hole penetrating the protective film 20.

FIG. 4 shows the result obtained by measuring the relationship between the interval ds between the contact hole CH1 or CH2 and an end of the semiconductor layer SC in the width direction and the output current Id of the thin-film transistor TR with respect to a model case of the thin-film transistor TR. The channel width W of the semiconductor layer SC is set to 100 μm. The channel length L is set to 3 μm. The drive voltage Vd is set to 0.1 V. The gate voltage Vg is set to 10 V.

As shown in FIG. 4, the output current Id is high when the interval ds is in a range of 5 to 30 μm. The output current Id declines after the interval ds exceeds 30 μm. This result reveals that the parasitic capacitance of the thin-film transistor TR is reduced by setting the interval ds to be greater than or equal to 5 μm and less than or equal to 30 μm. In this manner, the driving performance is improved.

The thin-film transistor TR of the display device having the above structure can reduce the inter-wiring capacitance Cgs between the source electrode SE and the gate electrode GE, the inter-wiring capacitance Cgd between the drain electrode DE and the gate electrode GE, and the inter-wiring capacitance Gds between the signal line S and the drain line D by decreasing the number of contact holes as much as possible and reducing the areas of the source electrodes, the drain electrodes and the wiring (the signal line S and the drain line). In addition, the interval between contact holes is set to be greater than or equal to 5 μm and less than or equal to 30 μm. The distance between the contact hole and an end of the source region or the drain region is set to be greater than or equal to 5 μm and less than or equal to 30 μm. Moreover, the signal line S and the drain line D are provided on sides opposite to the gate electrode GE with respect to the source electrode SE and the drain electrode DE, respectively. The signal line S and the drain line D are provided sufficiently away from each other. Thus, the inter-wiring capacitances Cgs, Cgd and Cds can be further reduced. In this manner, it is possible to reduce the parasitic capacitance of the thin-film transistor. This configuration realizes improvement of the driving performance and reduction of energy consumption.

In the first embodiment, the semiconductor layer of the thin-film transistor is not limited to polysilicon, and may be an oxide semiconductor layer. The number of source electrodes or drain electrodes is not limited to two, and may be one, three or more.

Now, this specification explains a thin-film transistor of a display device according to another embodiment. In the embodiment explained below, the same portions as those of the first embodiment are denoted by the same reference numbers or symbols. Thus, the detailed description of such portions is omitted. In the following embodiment, portions different from those of the first embodiment are mainly explained in detail.

Second Embodiment

FIG. 5 is a plan view showing a structural example of an array substrate in a display device according to a second embodiment. According to the second embodiment, drain electrodes DE and contact holes CH2, and source electrodes SE and contact holes CH1 are provided asymmetrically with respect to a gate electrode GE in a thin-film transistor TR. In other words, the drain electrodes DE and the contact holes CH2 are out of alignment with respect to the source electrodes SE and the contact holes CH1 in the direction of the channel width. Similarly, a drain line D and a signal line S are provided asymmetrically with respect to the gate electrode GE.

Each of layout intervals ds1, dd1, ds2, dd2, ds3 and dd3 of the contact holes CH1 and CH2 is set to be greater than or equal to 5 µm and less than or equal to 30 µm.

In this manner, the source electrodes SE and the contact holes CH1, and the drain electrodes DE and the contact holes CH2 are provided asymmetrically. This structure enables the inter-wiring capacitance to be further reduced. Thus, the parasitic capacitance of the thin-film transistor TR can be further reduced.

Third Embodiment

Figure 6:
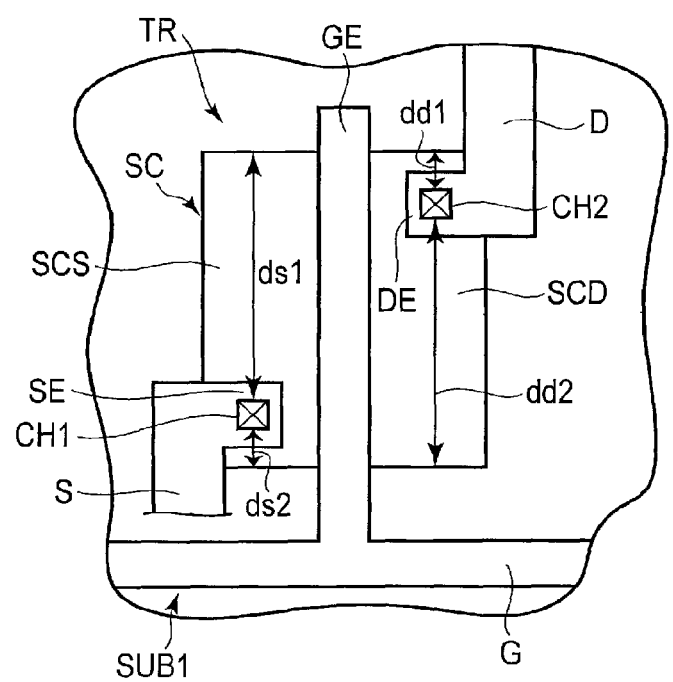
FIG. 6 is a plan view schematically showing a structural example of a thin-film transistor of a display device according to a third embodiment.

FIG. 6 is a plan view showing a structural example of an array substrate in a display device according to a third embodiment. In the third embodiment, a thin-film transistor TR comprises only one source electrode SE and only one drain electrode DE. The source electrode SE is connected to an end of a source region SCS in the width direction via a contact hole CH1. Here, the source electrode SE is connected to the end on the gate line G side. The drain electrode DE is connected to an end of a drain region SCD in the width direction via a contact hole CH2. Here, the drain electrode DE is connected to the upper end.

The interval ds1 between the contact hole CH1 and an end of the source region SCS, and the interval ds2 between the contact hole CH1 and the other end of the source region SCS are set such that each of these intervals is greater than or equal to 5 µm and less than or equal to 30 µm. Similarly, the interval dd1 between the contact hole CH2 and an end of the drain region SCD, and the interval dd2 between the contact hole CH2 and the other end of the drain region SCD are set such that each of these intervals is greater than or equal to 5 µm and less than or equal to 30 µm.

A signal line S is connected to the source electrode SE on a side opposite to a gate electrode GE, and extends from the source electrode in the direction of the gate line G. A drain line D is connected to the drain electrode DE on a side opposite to the gate electrode GE, and extends from the drain electrode in a direction opposite to that of the signal line S. Thus, the drain electrode DE, the contact hole CH2 and the drain line D, and the source electrode SE, the contact hole CH1 and the signal line S are provided asymmetrically with respect to the gate electrode GE. At the same time, the signal line S is provided away from the drain line D in the farthest position from the drain line D in the direction of opposing corners of a semiconductor layer SC.

In the third embodiment having the above structure, the number of contact holes is one. The areas of the source electrode, the drain electrode and the wiring (the signal line S and the drain line) are reduced as much as possible. In this manner, inter-wiring capacitances Cgs, Cgd and Cds can be further reduced. In addition, the interval between each contact hole and an end of the semiconductor layer is set to be greater than or equal to 5 µm and less than or equal to 30 µm. The signal line S is provided in the farthest position from the drain line D. Thus, the inter-wiring capacitance Cds can be further reduced. In this manner, it is possible to reduce the parasitic capacitance of the thin-film transistor. The driving performance can be improved and the energy consumption reduced.

Fourth Embodiment

Figure 7:
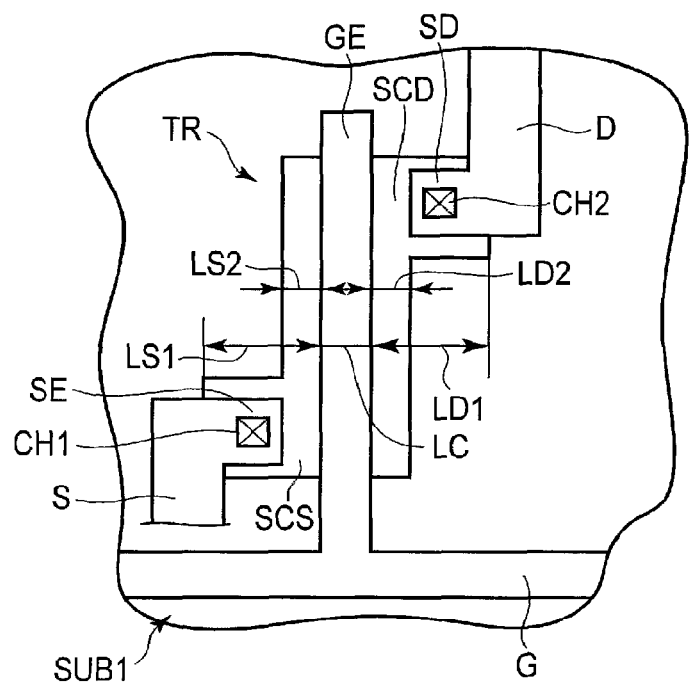
FIG. 7 is a plan view schematically showing a structural example of a thin-film transistor of a display device according to a fourth embodiment.

FIG. 7 is a plan view showing a structural example of an array substrate in a display device according to a fourth embodiment. According to the fourth embodiment, the length of a source region SCS of a semiconductor substrate SC in the direction of the channel length is set as follows. When the length of an area facing a contact hole CH1 is defined as LS1, and the length of the other area is defined as LS2, LS2 is set to be less than LS1. In the source region SCS, the length of the area other than the area facing the contact hole CH1 and a source electrode SE is set to be less.

Similarly, the length of a drain region SCD of the semiconductor layer SC in the direction of the channel length is set as follows. When the length of an area facing a contact hole CH2 is defined as LD1, and the length of the other area is defined as LD2, LD2 is set to be less than LD1. In the drain area SCD, the length of the area other than the area facing the contact hole CH2 and a drain electrode DE is set to be less.

In the fourth embodiment, the other structures of a thin-film transistor TR are the same as those of the thin-film transistor of the third embodiment.

In the fourth embodiment having the above structure, the parasitic capacitance of the thin-film transistor TR can be reduced. Thus, the driving performance can be improved and the energy consumption reduced. In addition, it is possible to reduce the area of the semiconductor layer SC and the size of the thin-film transistor TR. In this manner, a high-definition display device can be effectively realized.

Fifth Embodiment

Figure 8:
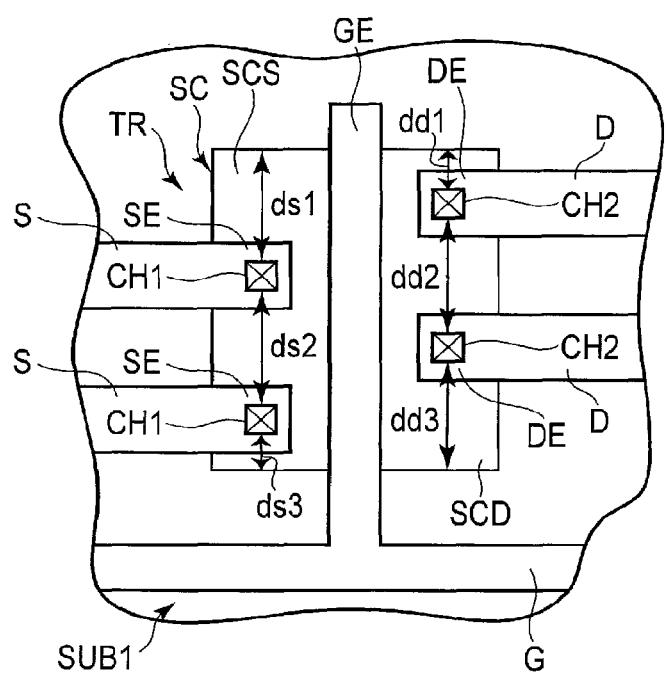
FIG. 8 is a plan view schematically showing a structural example of a thin-film transistor of a display device according to a fifth embodiment.

FIG. 8 is a plan view showing a structural example of an array substrate in a display device according to a fifth embodiment. In the fifth embodiment, signal lines S connected to source electrodes SE extend in the length direction of a semiconductor layer SC and in a direction depart from a gate electrode GE. Drain lines D connected to drain electrodes DE extend in the length direction of the semiconductor layer SC and in a direction depart from the gate electrode GE. The drain lines D extend in a direction opposite to that of the signal lines S.

In the fifth embodiment, the other structures of a thin-film transistor TR are the same as those of the thin-film transistor of the second embodiment. In the fifth embodiment having the above structure, the parasitic capacitance of the thin-film transistor TR can be reduced. Further, the driving performance can be improved and the energy consumption reduced.

Figure 9:
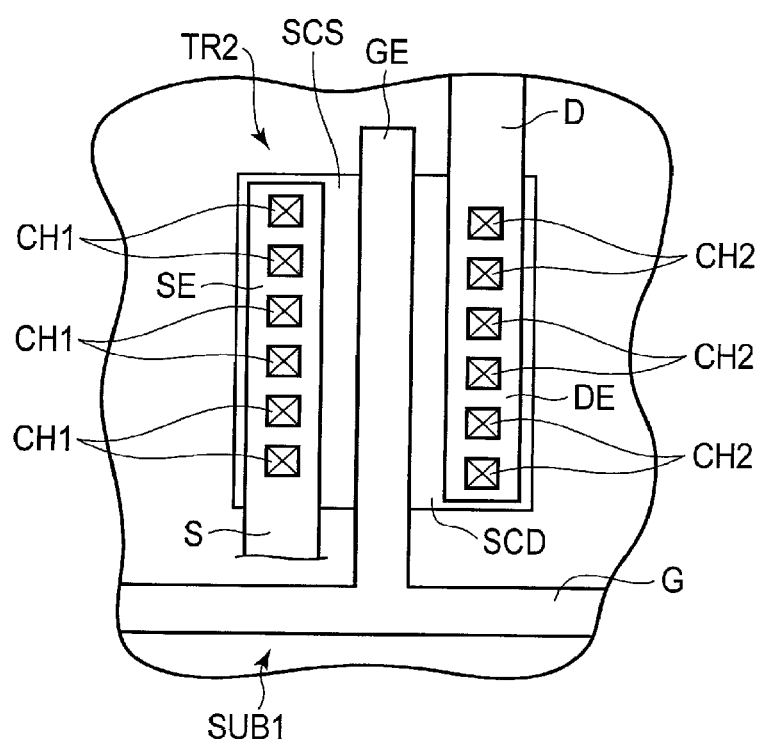
FIG. 9 is a plan view schematically showing a structural example of a thin-film transistor according to a comparative example.

FIG. 9 shows a thin-film transistor TR2 according to a comparative example. FIG. 10 shows the comparison of results obtained by measuring the inter-wiring capacitances (parasitic capacitances) of the thin-film transistors of the comparative example, the first embodiment, the third embodiment and the fourth embodiment.

As shown in FIG. 9, the thin-film transistor TR2 of the comparative example comprises a large number of, for example, six source electrodes SE and six contact holes CH1. The thin-film transistor TR2 further comprises a large number of, for example, six drain electrodes DE and six contact holes CH2. The six source electrodes SE are formed continuously and are connected to a source region SCS via the six contact holes CH1. The six drain electrodes DE are formed continuously and are connected to a drain region SCD via the six contact holes CH2.

As shown in FIG. 10, in the thin-film transistor TR2 of the comparative example, inter-wiring capacitance Cgs+Cgd is 0.98. Inter-wiring capacitance Cds is 0.02. The total capacitance Ct of these capacitances is 1.0. The total capacitance Ct of the thin-film transistor TR of the first embodiment is 0.97 and is decreased from the comparative example by 3%. The total capacitance Ct of the thin-film transistor TR of the third embodiment is 0.88 and is decreased from the comparative example by 12%. The total capacitance Ct of the thin-film transistor TR of the fourth embodiment is 0.95 and is decreased from the comparative example by 5%.

As described above, every embodiment can provide a thin-film transistor capable of reducing the parasitic capacitance, improving the driving performance and reducing the energy consumption.

In the above embodiments, a liquid crystal display device is shown as a disclosure example of a display device including a thin-film transistor. As other application examples, various types of flat-panel display devices can be considered. For example, an organic electroluminescent (EL) display device, other auto-luminous light-emitting display devices and an electronic paper display device comprising an electrophoretic element may be considered. It goes without saying that a structure or manufacturing process similar to that of the above-described embodiments can be applied to small, medium-sized and large display devices without particular limitation. In the above embodiments, each thin-film transistor is a single-gate thin-film transistor. However, a double-gate thin-film transistor may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

All of the structures which can be implemented by a person of ordinary skill in the art through arbitrary design changes based on the structures described above as the embodiments are included in the scope of the present invention as long as they encompass the spirit of the present invention. In addition, other effects which can be obtained by the above embodiments and are self-explanatory from the description of this specification or can be arbitrarily conceived by a person of ordinary skill in the art are considered to be achieved by the present invention as a matter of course.

What is claimed is:

1. A thin-film transistor comprising:
   a semiconductor layer comprising:
   a channel region having a channel length and a channel width greater than the channel length; and
   a source region and a drain region on both sides of the channel region;
   a gate electrode which faces the channel region with a first insulating layer being interposed;
   a second insulating layer which covers the first insulating layer and a gate electrode;
   a first electrode connected to the source region via a first contact hole formed on the first and second insulating layers;
   a second electrode connected to the drain region via a second contact hole formed on the first and second insulating layers;
   a source line connected to the first electrode; and
   a drain line connected to the second electrode, wherein
   a distance from the first and second contact holes to an end of the respective regions in a direction of the channel width is greater than or equal to 5 µm and less than or equal to 30 µm in the source region and the drain region, and
   the source line and the drain line extend in directions different from each other.

2. The thin-film transistor of claim 1, wherein
   the source line is connected to a side opposite to the gate electrode with respect to the first electrode, and
   the drain line is connected to a side opposite to the gate electrode with respect to the second electrode.

3. The thin-film transistor of claim 2, further comprising:
   a plurality of first electrodes connected to the source region via the respective first contact holes; and
   a plurality of second electrodes connected to the drain region via the respective second contact holes, wherein
   in the source region and the drain region, the first contact holes and the second contact holes are provided with space in the direction of the channel width, and an interval between the first contact holes and an interval between the second contact holes are greater than or equal to 5 µm and less than or equal to 30 µm.

4. The thin-film transistor of claim 2, wherein
   the first contact hole and the second contact hole are provided asymmetrically with respect to the gate electrode.

5. The thin-film transistor of claim 3, wherein
   the first contact holes and the second contact holes are provided asymmetrically with respect to the gate electrode.

6. The thin-film transistor of claim 5, wherein
   a length of the source region in a direction of the channel length is set such that a length of an area other than an area facing the first contact holes is less than a length of the area facing the first contact holes.

7. The thin-film transistor of claim 1, further comprising:
   a plurality of first electrodes connected to the source region via the respective first contact holes; and
   a plurality of second electrodes connected to the drain region via the respective contact holes, wherein
   in the source region and the drain region, the first contact holes and the second contact holes are provided with space in the direction of the channel width, and an interval between the first contact holes and an interval between the second contact holes are greater than or equal to 5 µm and less than or equal to 30 µm.

8. The thin-film transistor of claim 1, wherein
   the first contact hole and the second contact hole are provided asymmetrically with respect to the gate electrode.

9. The thin-film transistor of claim 7, wherein
   the first contact holes and the second contact holes are provided asymmetrically with respect to the gate electrode.

10. The thin-film transistor of claim 9, wherein
    a length of the source region in a direction of the channel length is set such that a length of an area other than an area facing the first contact holes is less than a length of the area facing the first contact holes.

11. The thin-film transistor of claim 1, wherein
    a length of the source region in a direction of the channel length is set such that a length of an area other than an area facing the first contact hole is less than a length of the area facing the first contact hole.

* * * * *